(12) United States Patent
Pasadyn et al.

(10) Patent No.: US 6,745,086 B1
(45) Date of Patent: Jun. 1, 2004

(54) METHOD AND APPARATUS FOR DETERMINING CONTROL ACTIONS INCORPORATING DEFECTIVITY EFFECTS

(75) Inventors: Alexander J. Pasadyn, Austin, TX (US); Thomas J. Sonderman, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 127 days.

(21) Appl. No.: 10/114,785

(22) Filed: Apr. 3, 2002

(51) Int. Cl.[7] .................. G06F 13/00; G06F 19/00; H01L 21/00

(52) U.S. Cl. .................. 700/28; 700/121; 438/5

(58) Field of Search .................. 438/5–18; 700/28–31, 700/121

(56) References Cited

U.S. PATENT DOCUMENTS 6,645,684 B2 * 11/2003 Atkinson et al. ............. 430/30

* cited by examiner

Primary Examiner—Evan Pert
(74) Attorney, Agent, or Firm—Williams, Morgan & Amerson, P.C.

(57) ABSTRACT

A method includes processing workpieces in accordance with an operating recipe. Metrology data associated with at least one of the workpieces is received. A proposed control action is generated based on the metrology data. A defectivity metric is generated based on the proposed control action. The proposed control action is modified based on the defectivity metric. A manufacturing system includes a process tool, a metrology tool, and a process controller. The process tool is configured to process workpieces in accordance with an operating recipe. The metrology tool is configured to provide metrology data associated with at least one of the workpieces. The process controller is configured to generate a proposed control action based on the metrology data, generate a defectivity metric based on the proposed control action, and modify the proposed control action based on the defectivity metric.

38 Claims, 5 Drawing Sheets

METHOD AND APPARATUS FOR DETERMINING CONTROL ACTIONS INCORPORATING DEFECTIVITY EFFECTS

BACKGROUND OF THE INVENTION

1. Field of the Invention

This invention relates generally to the field of semiconductor device manufacturing and, more particularly, to a method and apparatus for method and apparatus for determining control actions incorporating defectivity effects.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of process tools, including photolithography steppers, etch tools, deposition tools, polishing tools, rapid thermal process tools, implantation tools, etc. The technologies underlying semiconductor process tools have attracted increased attention over the last several years, resulting in substantial refinements. However, despite the advances made in this area, many of the process tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various process tools. The manufacturing tools communicate with a manufacturing framework or a network of processing modules. Each manufacturing tool is generally connected to an equipment interface. The equipment interface is connected to a machine interface that facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Target values for the various processes performed are generally based on design values for the devices being fabricated. For example, a particular process layer may have a target thickness. Operating recipes for deposition tools and/or polishing tools may be automatically controlled to reduce variation about the target thickness. In another example, the critical dimensions of a transistor gate electrode may have an associated target value. The operating recipes of photolithography tools and/or etch tools may be automatically controlled to achieve the target critical dimensions.

In some cases, the goal to achieve target values may competes with the simultaneous goal of minimizing defects in the fabricated devices. Defects can take the form of particle contamination, missing or extra patterns, electrical defects, feature damage (e.g., from overpolishing), electrical faults, etc. Different processes performed during the fabrication of devices, by nature, have different propensities for inducing defects in the processed devices. A process control variable that is modified to achieve a target value goal may also effect the propensity of the process to induce defects. For example, in a chemical mechanical planarization process, process variables, such as polishing pressure, polish time, polishing rotation speed, etc. may be controlled automatically to achieve desired process layer removal rates and/or wafer surface uniformity characteristics. However, changing the process control variables also has the effect of changing the defectivity characteristics of the process. For example, as polishing pressure or time increases, the likelihood of damaging the features underlying the polished layer increases. If an underpolishing condition exists, remnants of the process layer may be still present in undesirable locations.

FIG. 1A illustrates a cross-section of an exemplary semiconductor device 100 that is subjected to a planarization process. Process variables associated with the planarization process may be controlled to achieve desired post-planarization targets. The semiconductor device 100 includes a base layer 110 with a plurality of trenches 120 defined therein. For example, the base layer 110 may be a dielectric layer (e.g., dielectric constant less than 5.0), such as silicon dioxide, and the trenches 120 may be used to form copper interconnect lines. In another example, the base layer 110 may be a substrate layer (e.g., an epitaxial silicon layer formed over a bulk silicon substrate), and the trenches 120 may be used to form shallow trench isolation (STI) structures between active regions of subsequently formed devices (e.g., transistors). A process layer 130 (e.g., copper for an interconnect line and silicon dioxide for an STI structure) is formed over the base layer to fill the trenches 120. One or more intermediate layers, such as a stop layer (not shown) may be formed between the base layer 110 and the process layer 130.

As seen in FIG. 1B, the process layer 130 is polished to remove the portions not disposed within the trenches 120. Various endpoint techniques may be used for determining the end point for the polishing process, however, these endpoint detection techniques are approximate, and some polishing may continue after the process layer 130 has been cleared.

The chemical slurry used in the polishing process typically has a higher etch rate for the material of the process layer 130. Hence, as the polishing process nears completion, the process layer 130 will be removed at a faster relative rate than the base layer 110 or underlying stop layer (not shown). A flexible polishing pad used in the polishing process may conform to the surface of the base layer 110 and process layer 130 and continue to polish the process layer 130 at a faster rate, resulting in the removal of a portion 140 of the process layer 130 disposed within the trench 120. This phenomenon is commonly referred to as dishing. It is also possible that portions 150 of the base layer 110 may be removed during the polishing process, resulting in a phenomenon commonly referred to as erosion. In general, the susceptibility of the process layer 130 to dishing and the base layer 110 to erosion is dependent somewhat on the width and spacing (i.e., pitch) of the trenches 120. Wider features allow the polishing pad to conform to the surface easier and exacerbate a dishing problem. Collectively, dishing and erosion are referred to herein as surface degradation.

Surface degradation can cause various problems in the fabrication of the semiconductor device 100. For example, dishing reduces the amount of the process layer 130 (e.g., silicon dioxide or conductive material) disposed in the trenches. If the amount of material removed is significant, the electrical properties of the features may be altered. For example, an STI structure may have reduced insulating capacity and a conductive feature may have increased resistivity. Likewise, erosion affects the properties of the base layer 110. Surface degradation can result in a reduction in the performance of the completed device (e.g., speed rating, power consumption, leakage current, etc.).

Hence, the process control goal of removing the process layer competes with the defect reduction goals of minimizing dishing or erosion and of not leaving remnants of process layer material behind.

The present invention is directed to overcoming, or at least reducing the effects of, one or more of the problems set forth above.

SUMMARY OF THE INVENTION

One aspect of the present invention is seen in a method including processing workpieces in accordance with an operating recipe. Metrology data associated with at least one of the workpieces is received. A proposed control action is generated based on the metrology data. A defectivity metric is generated based on the proposed control action. The proposed control action is modified based on the defectivity metric.

Another aspect of the present invention is seen in a manufacturing system including a process tool, a metrology tool, and a process controller. The process tool is configured to process workpieces in accordance with an operating recipe. The metrology tool is configured to provide metrology data associated with at least one of the workpieces. The process controller is configured to generate a proposed control action based on the metrology data, generate a defectivity metric based on the proposed control action, and modify the proposed control action based on the defectivity metric.

BRIEF DESCRIPTION OF THE DRAWINGS

The invention may be understood by reference to the following description taken in conjunction with the accompanying drawings, in which like reference numerals identify like elements, and in which.

Figure 1A:
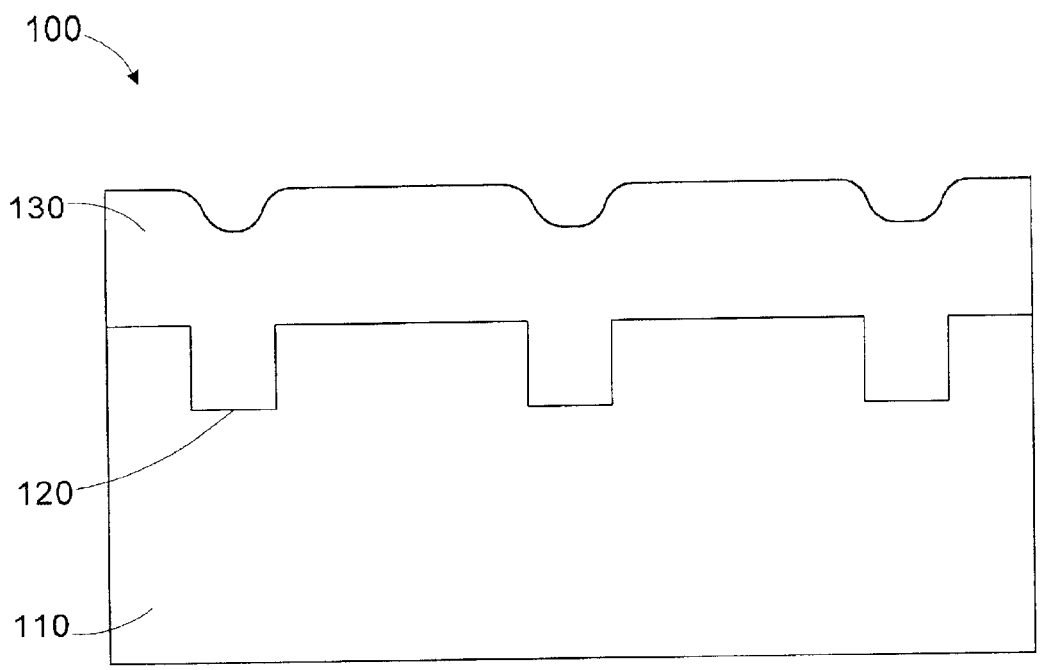
FIGS. 1A and 1B are cross section views of an exemplary semiconductor device on which a polishing process is performed.
Figure 1B:
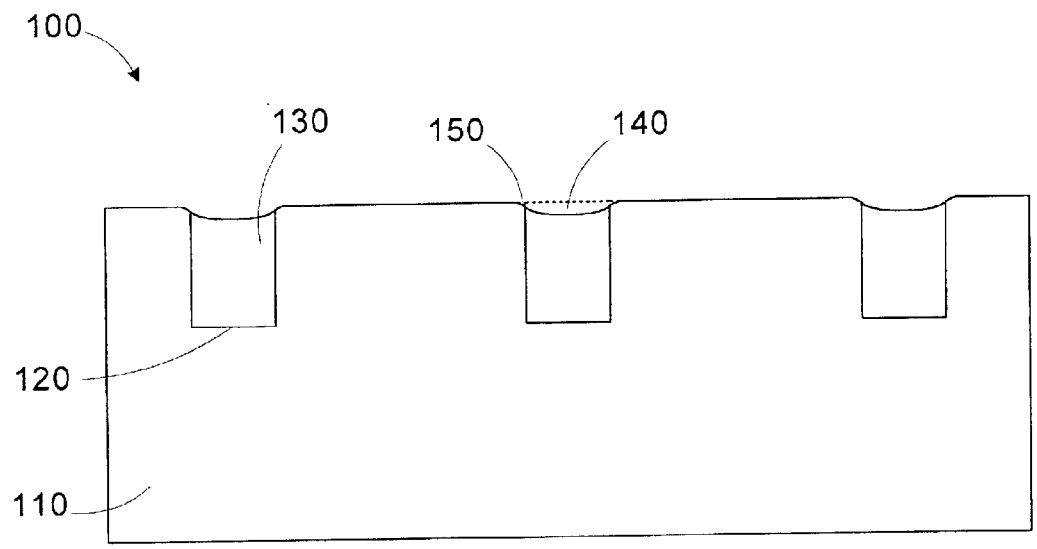

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
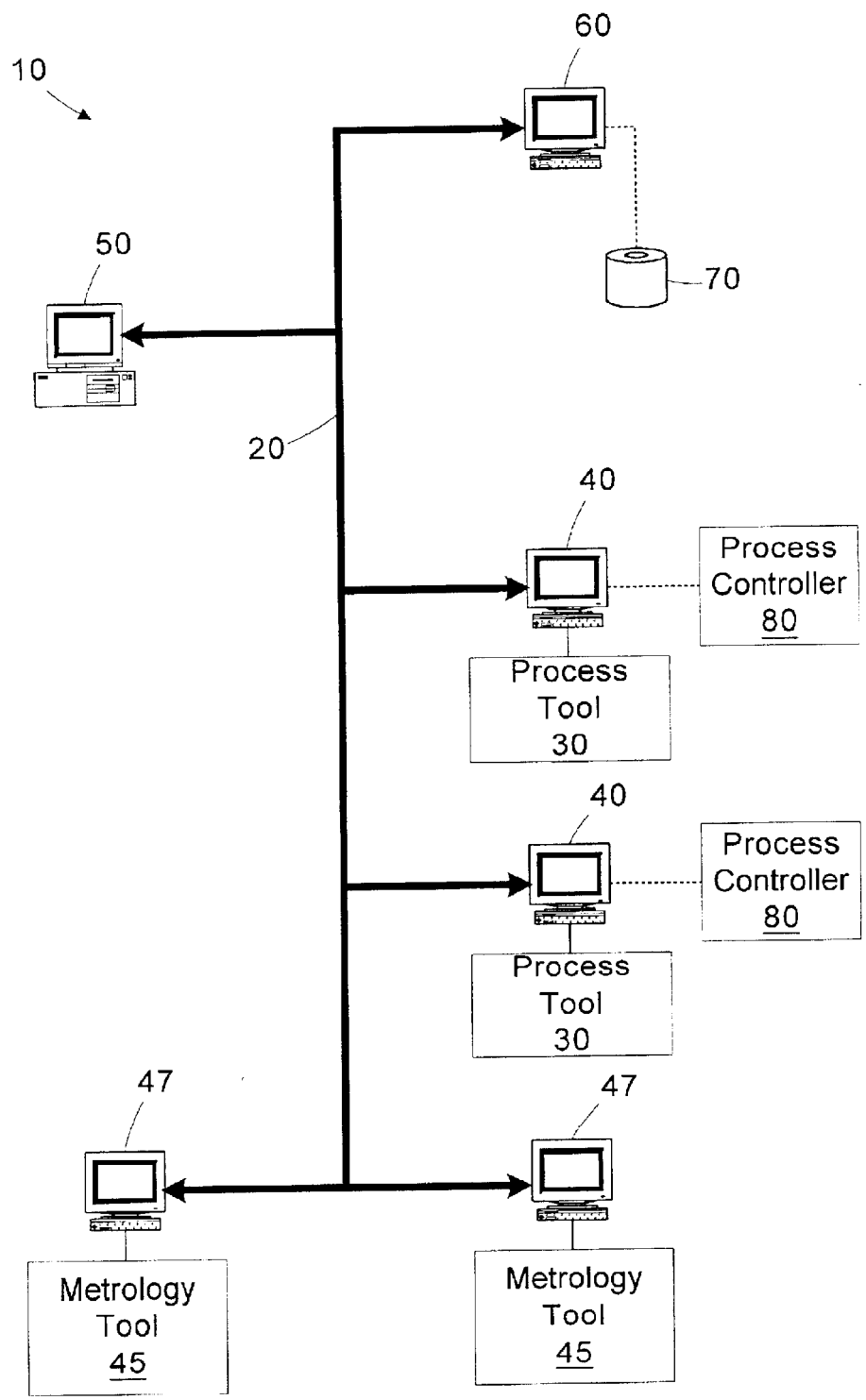
FIG. 2 is a simplified block diagram of a manufacturing system in accordance with one illustrative embodiment of the present invention.

Referring to FIG. 2, a simplified block diagram of an illustrative manufacturing system 10 is provided. In the illustrated embodiment, the manufacturing system is adapted to process semiconductor wafers, however, the invention is not so limited and may be applied to other types of manufacturing environments and other types of workpieces. A network 20 interconnects various components of the manufacturing system, allowing them to exchange information. The illustrative manufacturing system 10 includes a plurality of process tools 30, each being coupled to a computer 40 for interfacing with the network 20. The manufacturing system 10 also includes one or more metrology tools 45 coupled to a computer 47 for interfacing with the network 20. The metrology tools 45 may be used to measure output characteristics of the wafers processed in the process tool 30 to generate metrology data. Although the tools 30, 45 are illustrated as interfacing with the network 20 through the computers 40, 47, the tools 30, 45 may include integrated circuitry for interfacing with the network 20, eliminating the need for the computers 40, 47. A manufacturing execution system (MES) server 50 directs the high level operation of the manufacturing system 10 by directing the process flow of the manufacturing system 10. The MES server 50 monitors the status of the various entities in the manufacturing system, including the tools 30, 45. The process tools 30 may be process tools, such as photolithography steppers, etch tools, deposition tools, polishing tools, rapid thermal process tools, implantation tools, etc.

A database server 60 is provided for storing data related to the status of the various entities and workpieces (e.g., wafers) in the process flow. The database server 60 may store information in one or more data stores 70. The metrology data may include feature measurements, process layer thicknesses, electrical performance characteristics, defect measurements, surface profiles, etc. Maintenance history for the tools 30–80 (e.g., cleaning, consumable item replacement, repair) may also be stored in the data store 110 by the MES server 90 or by a tool operator. The distribution of the processing and data storage functions amongst the different computers 40, 47, 50, 60 is generally conducted to provide independence and a central information store. Of course, different numbers of computers and different arrangements may be used.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Some of the process tools 30 include process controllers 80 that are adapted to automatically control the operating recipes of their respective tools 30. A particular process tool 30 may have more than one process controller 80 adapted to control more than one operating recipe parameter based on feedback and/or feedforward metrology data collected. If the tool 30 is a CMP tool, the process controller 80 may receive pre-polish thickness measurements (e.g., thickness of high features, thickness of low features) and predict a polishing time or pressure required to achieve a post-polish target thickness. In the case where the process tool 30 is an etch tool, the process controller 80 may model the etching performance of the process tool 30 based on pre-etch and/or post-etch thickness measurements. The process controller 80 may use a control model of the process tool 30 to generate its prediction. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected. Using the control model, the process controller 80 may determine operating recipe parameters to reduce post-processing variations. The particular control scenario depends on the particular type of process tool 30 being controlled.

Figure 3:
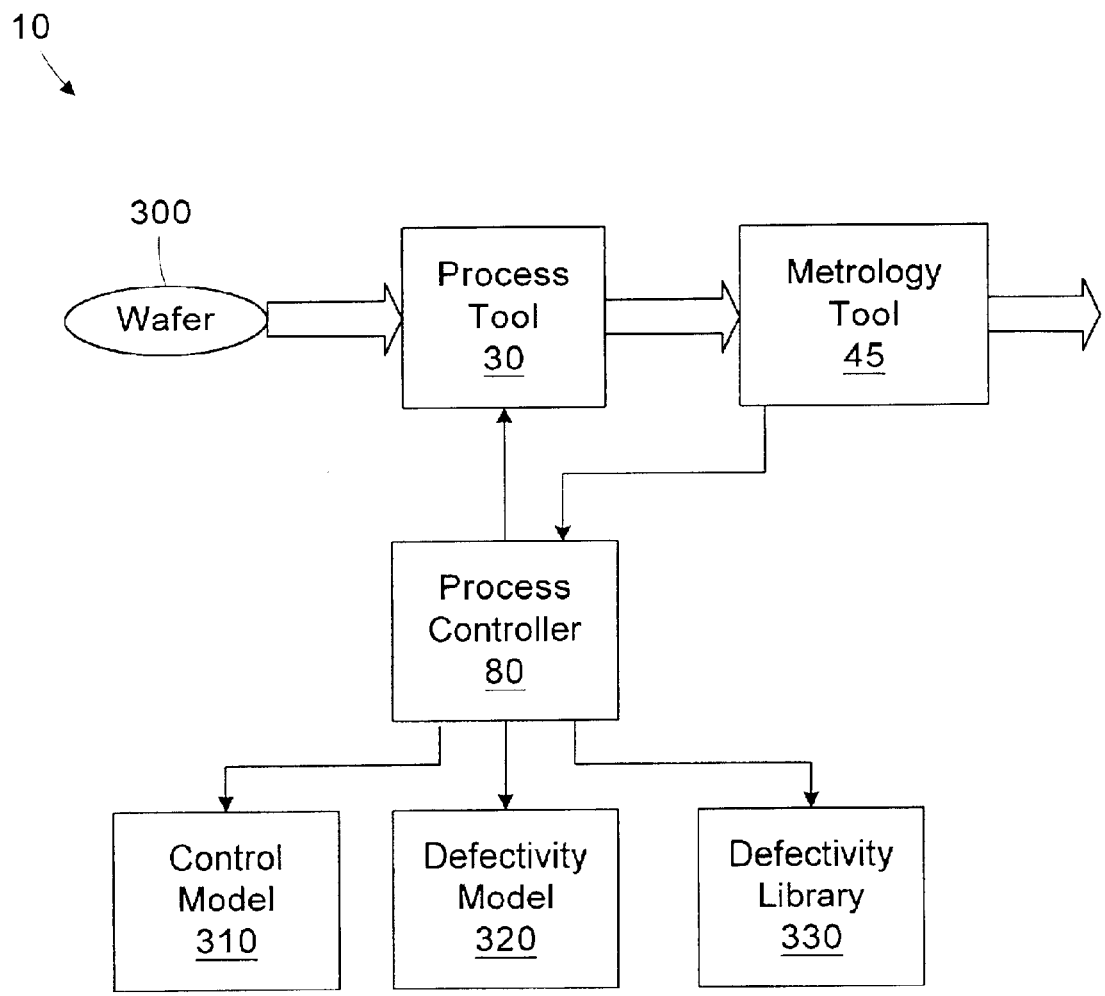
FIG. 3 is a simplified block diagram of a portion of the manufacturing system of FIG. 2.

Referring now to FIG. 3, a simplified block diagram of a portion of the manufacturing system of FIG. 2 is provided. The process tool 30 processes wafers 300 according to an operating recipe. The process tool 30 may also be a single chamber of a multiple chamber tool 30–80. The metrology tool 45 measures output characteristics of the wafers processed in the process tool 30 to gauge the efficacy of the process implemented by the process tool 30. The metrology data collected by the metrology tool. 45 is passed to the process controller 80 for dynamically updating the operating recipe of the process tool 30 to reduce variation between the measured output characteristic and a target value for the characteristic.

As described in greater detail below, the process controller 80 incorporates defectivity information into its control action decision making process using an objective function analysis. The process controller 80 employs a control model 310 for generating a proposed control action for updating a process variable in the operating recipe. In an example using a simple control equation, the control action for generating the new process variable setting based on a feedback metrology measurement may be defined as:

$$\text{New Setting} = \text{Old Setting} + C_1 * (\text{Target Characteristic Value} - \text{Measured Characteristic Value}) \quad (1)$$

Figure 4A:
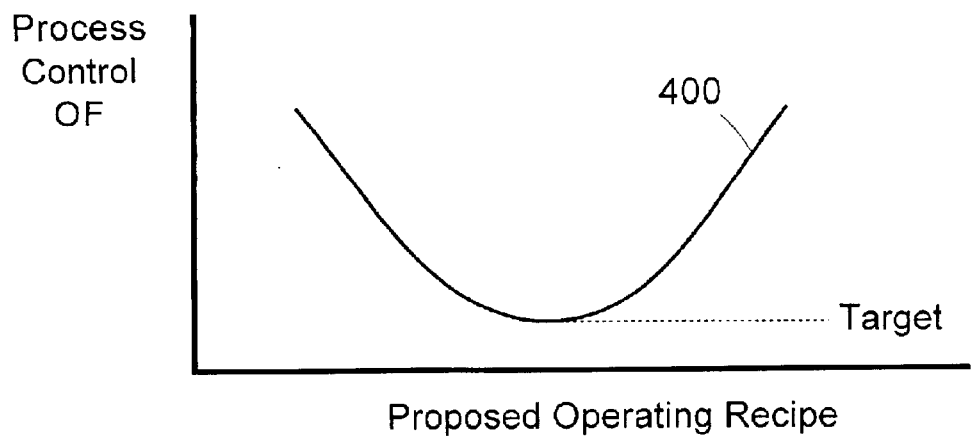
FIGS. 4A and 4B are graphs illustrating components of an objective function.

For example, the process controller 80 may increase the polishing pressure or time based on the measured error. The process control goal of the process controller 80 is to reduce variation between the target value and the measured value. FIG. 4A represents an exemplary process control component

400 of an objective function. The process control component 400 is minimized at the point where the target value matches the expected actual characteristic value resulting from the new process setting. Typically, the process controller 80 minimizes the 400 by setting the new process setpoint at the value calculated by the control model 310. Deviations from the calculated setpoint may be related to expected deviations between the target value and the expected measured value based on the proposed operating recipe and the tool state.

Figure 4B:
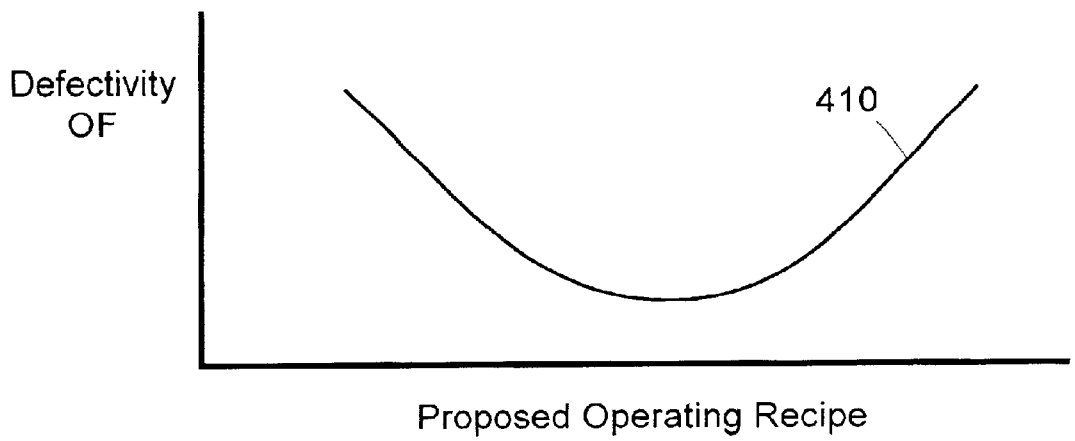

However, by changing the process setting, the process controller 80 may also increase the propensity for defects to be formed during the processing of the wafer 300. To account for the defectivity effects of the control action, the process controller 80 determines a defectivity component 410 of the objective function (shown in FIG. 4B). The defectivity component 410 is determined by generating a defectivity metric as a function of the proposed operating recipe parameters and the state of the process tool 30. Specific techniques for determining the defectivity metric are described in greater detail below. The defectivity component 410 illustrated in FIG. 4B represents defectivity as a function of polish time. This representation is a simplification, because the defectivity is typically a function of more than one of the operating recipe parameters. The defectivity has a minimum value which corresponds to a prediction that all of the process layer will be removed without damaging the underlying features. As the polish time increases, the propensity to damage the features (i.e., overpolishing) increases, resulting in an increase in the objective function As the polish time decreases, the likelihood of not removing all the desired portions of the process layer (i.e., underpolishing) increases, thereby causing a corresponding increase in the objective function. The specific shape of the defectivity component 410 depends on the particular nature of the process being performed.

The process controller 80 combines the process control component 400 and the defectivity component 410 to generate a composite objective function that may be expressed in a simplified form as:

$$OF = K_1 *(\text{Desired Target} - \text{Predicted Measurement})^2 + K_2 *(\text{Defectivity Metric}) \quad (2)$$

The process controller 80 selects an operating recipe that minimizes the objectivity function. Such a configuration allows the process controller 80 to attempt to achieve its process control goals without doing so in a manner that counterproductively increases the defects induced in the device by the processing. The gain factors $K_1$ and $K_2$ in the composite objective function may be adjusted to weight the process control and defectivity objectives. For example, in a process where a higher degree of variation is acceptable, but a lower defect rate is desired, the gain constant $K_2$ may be increased relative to $K_1$. Similarly, the gain constant $K_1$ may be greater in a process where tighter process control is desired.

To minimize the objective function, the process controller 80 may generate a plurality of candidate operating recipes and select the candidate having the minimum objective function value. For example, the process controller 80 may generate N candidate operating recipes having control setting values that vary from the current setting to the setting generated by the control model 310 in fixed increments. The particular technique for selecting candidate operating recipes may vary depending on the particular implementation.

Based on the candidate operating recipes, the process controller 80 determines a defectivity measure, or metric, associated with each of the candidate operating recipes and selects the candidate having the lowest composite objective function value. There are various techniques that the process controller 80 may use to determine the defectivity metric. In one embodiment, the process controller 80 may access a defectivity model 320 using the operating recipe parameters to calculate the defectivity metric. Various modeling techniques, well known to those of ordinary skill in the art, are suitable for implementing the defectivity model 320. The defectivity model 320 may be developed empirically using commonly known linear or non-linear techniques. The defectivity model 320 may be a relatively simple equation based model (e.g., linear, exponential, weighted average, etc.) or a more complex model, such as a neural network model, principal component analysis (PCA) model, or a projection to latent structures (PLS) model. The specific implementation of the defectivity model 320 may vary depending on the modeling technique selected.

In another embodiment, the process controller 80 may access a defectivity library 330 including a plurality of reference operating recipes. Each reference operating recipe has an associated defectivity metric. The process controller 80 compares the candidate operating recipe to the entries in the defectivity library 330 and identifies the reference operating recipe closest to the candidate operating recipe. Techniques for matching the candidate operating recipe to the closest reference operating recipe are well known to those of ordinary skill in the art, so they are not described in greater detail herein. For example, a minimum least squares or nearest neighbor approach may be used.

In addition to determining the defectivity metrics for the candidate operating recipes, the process controller 80 calculates the process control components 400 and selects the candidate operating recipe having the minimum value. Although the invention has been illustrated using a feedback control example, it may also be applied to a feedforward control scenario.

Figure 5:
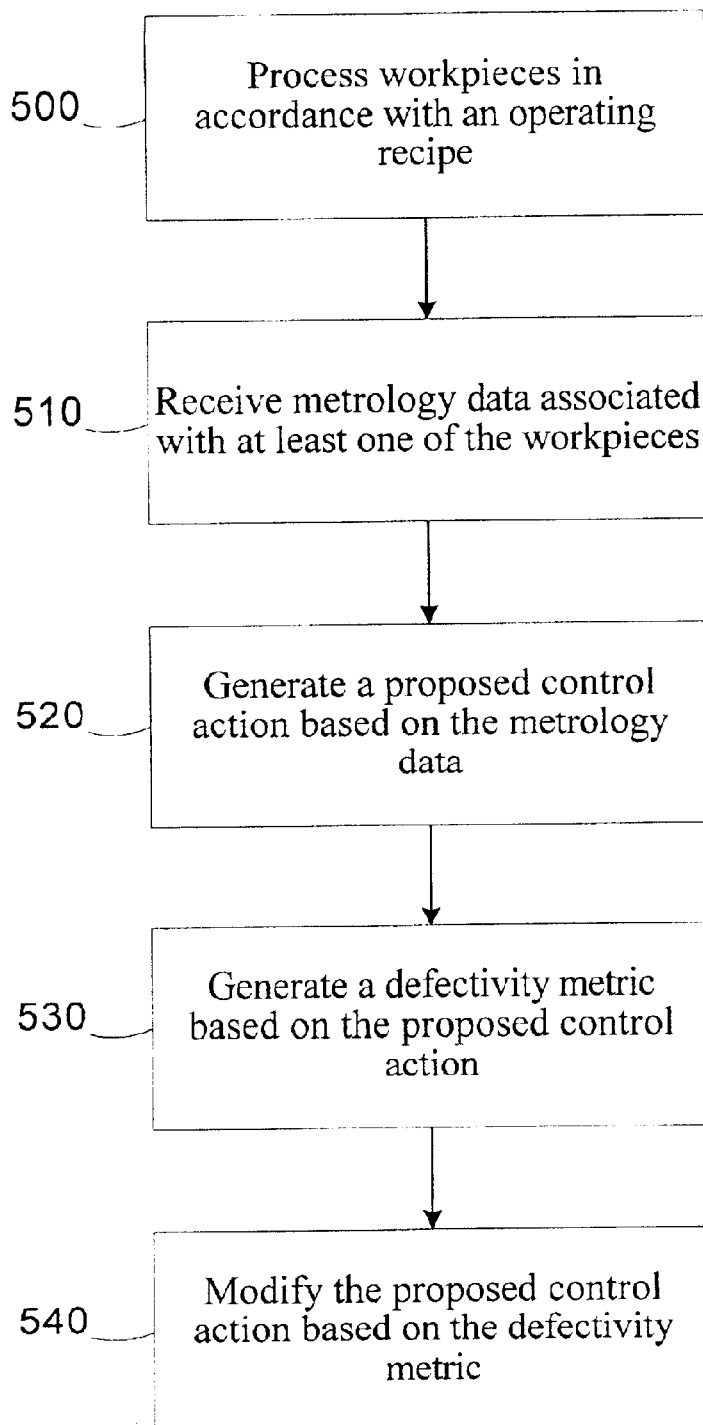
FIG. 5 is a simplified flow diagram of a method for control actions incorporating defectivity effects in accordance with another illustrative embodiment of the present invention.

Turning now to FIG. 5, a simplified flow diagram of a method for determining a control action in accordance with another illustrative embodiment of the present invention is provided. In block 500, workpieces are processed in accordance with an operating recipe. In block 510, metrology data associated with at least one of the workpieces is received. In block 520, a proposed control action is generated based on the metrology data. In block 530, a defectivity metric is generated based on the proposed control action. In block 540, the proposed control action is modified based on the defectivity metric.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

processing workpieces in accordance with an operating recipe;

receiving metrology data associated with at least one of the workpieces;

generating a proposed control action based on the metrology data;

generating a defectivity metric based on the proposed control action; and modifying the proposed control action based on the defectivity metric.

2. The method of claim 1, further comprising generating at least one candidate operating recipe based on the proposed control action and generating the defectivity metric further comprises generating the defectivity metric based on the candidate operating recipe.

3. The method of claim 2, wherein determining the defectivity metric further comprises:
   comparing the candidate operating recipe to a library of reference operating recipes, each reference operating recipe having an associated defectivity metric;
   selecting the reference operating recipe closest to the operating recipe; and
   selecting the defectivity metric associated with the selected reference operating recipe.

4. The method of claim 1, wherein determining the defectivity metric further comprises applying a defectivity model to the candidate operating recipe.

5. The method of claim 1, further comprising computing an objective function based on the proposed control action and the defectivity metric.

6. The method of claim 5, further comprising:
   minimizing the objective function; and
   generating a final control action based on the minimized objective function.

7. The method of claim 5, wherein computing the objective function further comprises:
   determining a process control component of the objective function based on the proposed control action;
   determining a defectivity component of the objective function based on the defectivity metric; and
   combining the process control component and the defectivity component to generate the objective function.

8. The method of claim 7, wherein determining the process control component further comprises determining the process control component based on a difference between a target characteristic value associated with the workpieces and a predicted characteristic value.

9. The method of claim 7, wherein combining further comprising the process control component and the defectivity component further comprises:
   applying a first weighting factor to the process control component; and
   applying a second weighting factor to the defectivity component.

10. The method of claim 8, wherein combining the process control component and the defectivity component further comprises adding the process control component and the defectivity component.

11. The method of claim 1, further comprising:
    determining a plurality of candidate operating recipes based on the proposed control action;
    determining a defectivity metric associated with each of the candidate operating recipes;
    calculating an objective function based on the candidate operating recipes, the objective function including a process control component calculated based on the candidate operating recipes and a defectivity component calculated based on the associated defectivity metrics;
    minimizing the objective function; and
    generating a final control action based on the minimized objective function.

12. The method of claim 1, wherein generating the proposed control action further comprises generating a proposed feedback control action based on the metrology data.

13. The method of claim 1, wherein generating the proposed control action further comprises generating a proposed feedforward control action based on the metrology data.

14. A method, comprising:
    processing workpieces in accordance with an operating recipe;
    receiving metrology data associated with at least one of the workpieces;
    generating a proposed control action based on the metrology data;
    generating a defectivity metric based on the proposed control action;
    computing an objective function based on the proposed control action and the defectivity metric; and
    generating a final control action based on the minimized objective function.

15. The method of claim 14, wherein computing the objective function further comprises:
    determining a process control component of the objective function based on the proposed control action;
    determining a defectivity component of the objective function based on the defectivity metric; and
    combining the process control component and the defectivity component to generate the objective function.

16. The method of claim 15, wherein determining the process control component further comprises determining the process control component based on a difference between a target characteristic value associated with the workpieces and a predicted characteristic value.

17. The method of claim 15, wherein combining further comprising the process control component and the defectivity component further comprises:
    applying a first weighting factor to the process control component; and
    applying a second weighting factor to the defectivity component.

18. The method of claim 17, wherein combining the process control component and the defectivity component further comprises adding the process control component and the defectivity component.

19. A manufacturing system, comprising:
    a process tool configured to process workpieces in accordance with an operating recipe;
    a metrology tool configured to provide metrology data associated with at least one of the workpieces; and
    a process controller configured to generate a proposed control action based on the metrology data, generate a defectivity metric based on the proposed control action, and modify the proposed control action based on the defectivity metric.

20. The system of claim 19, wherein the process controller is further configured to generate at least one candidate operating recipe based on the proposed control action and generate the defectivity metric based on the candidate operating recipe.

21. The system of claim 20, wherein the process controller is further configured to compare the candidate operating recipe to a library of reference operating recipes, each reference operating recipe having an associated defectivity metric, select the reference operating recipe closest to the operating recipe, and select the defectivity metric associated with the selected reference operating recipe.

22. The system of claim 19, wherein the process controller is further configured to apply a defectivity model to the candidate operating recipe to generate the defectivity metric.

23. The system of claim 19, wherein the process controller is further configured to compute an objective function based on the proposed control action and the defectivity metric.

24. The system of claim 23, wherein the process controller is further configured to minimize the objective function and generate a final control action based on the minimized objective function.

25. The system of claim 23, wherein the process controller is further configured to determine a process control component of the objective function based on the proposed control action, determine a defectivity component of the objective function based on the defectivity metric, and combine the process control component and the defectivity component to generate the objective function.

26. The system of claim 25, wherein the process controller is further configured to determine the process control component based on a difference between a target characteristic value associated with the workpieces and a predicted characteristic value.

27. The system of claim 25, wherein the process controller is further configured to apply a first weighting factor to the process control component and apply a second weighting factor to the defectivity component.

28. The system of claim 26, wherein the process controller is further configured to add the process control component and the defectivity component.

29. The system of claim 19, the process controller is further configured to determine a plurality of candidate operating recipes based on the proposed control action, determine a defectivity metric associated with each of the candidate operating recipes, calculate an objective function based on the candidate operating recipes, the objective function including a process control component calculated based on the candidate operating recipes and a defectivity component calculated based on the associated defectivity metrics, minimize the objective function, and generate a final control action based on the minimized objective function.

30. The method of claim 19, wherein the process controller is further configured to generate a proposed feedback control action based on the metrology data.

31. The method of claim 19, wherein the process controller is further configured to generate a proposed feedforward control action based on the metrology data.

32. A manufacturing system, comprising:
a process tool configured to process workpieces in accordance with an operating recipe;
a metrology tool configured to provide metrology data associated with at least one of the workpieces; and
a process controller configured to generate a proposed control action based on the metrology data, generate a defectivity metric based on the proposed control action, compute an objective function based on the proposed control action and the defectivity metric, and generate a final control action based on the minimized objective function.

33. The system of claim 32, wherein the process controller is further configured to determine a process control component of the objective function based on the proposed control action, determine a defectivity component of the objective function based on the defectivity metric, and combine the process control component and the defectivity component to generate the objective function.

34. The system of claim 33, wherein the process controller is further configured to determine the process control component based on a difference between a target characteristic value associated with the workpieces and a predicted characteristic value.

35. The system of claim 33, wherein the process controller is further configured to apply a first weighting factor to the process control component and apply a second weighting factor to the defectivity component.

36. The system of claim 35, wherein the process controller is further configured to add the process control component and the defectivity component.

37. A manufacturing system, comprising:
means for processing workpieces in accordance with an operating recipe;
means for receiving metrology data associated with at least one of the workpieces;
means for generating a proposed control action based on the metrology data;
means for generating a defectivity metric based on the proposed control action; and
means for modifying the proposed control action based on the defectivity metric.

38. A manufacturing system, comprising:
means for processing workpieces in accordance with an operating recipe;
means for receiving metrology data associated with at least one of the workpieces;
means for generating a proposed control action based on the metrology data;
means for generating a defectivity metric based on the proposed control action;
means for computing an objective function based on the proposed control action and the defectivity metric; and
means for generating a final control action based on the minimized objective function.

* * * * *